(12) United States Patent
Xiang

(10) Patent No.: US 6,440,806 B1
(45) Date of Patent: Aug. 27, 2002

(54) METHOD FOR PRODUCING METAL-SEMICONDUCTOR COMPOUND REGIONS ON SEMICONDUCTOR DEVICES

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,859

(22) Filed: Apr. 30, 2001

(51) Int. Cl.$^7$ ............................................. H01L 21/336
(52) U.S. Cl. ........................ 438/290; 438/303; 438/299; 438/302; 438/682
(58) Field of Search ................................ 438/303, 682, 438/683, 290, 306, 149, 301

(56) References Cited

U.S. PATENT DOCUMENTS

| | | | | |
|---|---|---|---|---|
| 4,450,041 A | * | 5/1984 | Aklufi ........................ 156/628 |
| 4,577,396 A | * | 3/1986 | Yamamoto et al. ........... 29/576 |
| 5,093,280 A | * | 3/1992 | Tully ........................ 437/184 |
| 5,394,012 A | | 2/1995 | Kimura |
| 5,593,923 A | | 1/1997 | Horiuchi et al. |
| 5,893,751 A | | 4/1999 | Jenq et al. |
| 5,895,244 A | * | 4/1999 | Wu ............................ 438/303 |
| 6,046,090 A | * | 4/2000 | Wu ............................ 438/303 |
| 6,063,680 A | * | 5/2000 | Wu ............................ 438/303 |
| 6,063,706 A | * | 5/2000 | Wu ............................ 438/682 |
| 6,063,709 A | * | 5/2000 | Wu ............................ 438/682 |
| 6,087,234 A | * | 7/2000 | Wu ............................ 438/299 |
| 6,071,959 A1 | * | 1/2001 | Nagabushnam ............. 438/683 |
| 6,312,998 B1 | * | 11/2001 | Yu ............................ 438/303 |
| 6,313,036 B1 | * | 11/2001 | Oda ............................ 438/682 |
| 6,319,805 B1 | * | 11/2001 | Iwamatsu et al. ........... 438/592 |

* cited by examiner

*Primary Examiner*—David Nelms
*Assistant Examiner*—Thao Le
(74) *Attorney, Agent, or Firm*—Renner, Otto, Boisselle & Sklar, LLP

(57) ABSTRACT

A method of making metal-semiconductor compound regions, such as silicide regions, includes forming a metal layer on a surface of a semiconductor device, performing a first annealing to form metal-semiconductor regions, and depositing additional metal within and/or underneath the metal-semiconductor regions. The depositing may be accomplished by ion implantation. Following the depositing, a second annealing is performed to recrystallize the metal-semiconductor compounds and/or to increase the size of the metal-semiconductor compound regions.

25 Claims, 2 Drawing Sheets

METHOD FOR PRODUCING METAL-SEMICONDUCTOR COMPOUND REGIONS ON SEMICONDUCTOR DEVICES

BACKGROUND OF THE INVENTION

1. Technical Field

The present invention generally relates to methods for producing metal-semiconductor compound regions on semiconductor devices.

2. Description of the Related Art

The semiconductor industry is increasingly characterized by a growing trend toward fabricating larger and more complex circuits on a given semiconductor chip. This is being achieved by reducing the size of individual devices within the circuits and spacing the devices closer together. The reduction of the size of individual devices and the closer spacing brings about improved electrical performance.

There is increasing interest in metal-oxide-semiconductor (MOS) integrated circuits in which the component devices have gate dimensions as small as 0.35 µm or less. Devices having such small dimensions suffer from certain problems that are not of serious concern when the gate dimensions are greater than about 1 µm.

Two of the major goals of metal-oxide-semiconductor field effect transistor (MOSFET) scaling are to increase the density and the speed of the integrated circuits in which the scaled-down devices are to be used. To increase density, the physical dimensions of each integrated circuit have to be reduced which means smaller channel lengths and widths. As the physical dimensions of the integrated circuit reaches the submicron regime, all of the device parameters that affect performance of the integrated circuit become important.

One of the parameters that has become critical is the contact technology used in coupling transistors to make interconnections between transistors and other components of integrated circuits. As size of individual components is decreased, it becomes increasingly difficult to fabricate contacts with desirable characteristics, such as low resistance and impedance.

SUMMARY OF THE INVENTION

A method of making metal-semiconductor compound regions, such as silicide regions, includes forming a metal layer on a surface of a semiconductor device, performing a first annealing to form metal-semiconductor regions, and depositing additional metal within and/or underneath the metal-semiconductor regions. The depositing may be accomplished by ion implantation. Following the depositing, a second annealing is performed to recrystallize the metal-semiconductor compounds and/or to increase the size of the metalsemiconductor compound regions.

According to an aspect of the invention, a method of forming metal-semiconductor compounds includes depositing metallic ions beneath a surface of semiconductor material.

According to another aspect of the invention, a method of forming metal-semiconductor compounds includes depositing metallic ions in a semiconductor material after between a pair of annealing steps used to form metal-semiconductor compound material.

According to a yet another aspect of the invention, a method of forming metal-semiconductor compounds includes depositing metallic ions at least partially within a metal-semiconductor compound region, followed by annealing.

According to still another aspect of the invention, a method of making metal-semiconductor compound regions in a semiconductor device includes the steps of: depositing a metal layer on source and drain regions of a transistor; annealing the device to form respective source and drain metal-semiconductor compound regions in the source region and the drain region; removing unreacted metal of the metal layer; and implanting metal ions in the source region and the drain region.

According to a further aspect of the invention, a method of making silicide regions in a semiconductor device includes the steps of: depositing a metal layer on source and drain regions of a transistor; performing a first annealing of the device to form respective source and drain metal-semiconductor compound regions in the source region and the drain region; removing unreacted metal of the metal layer; depositing additional metal in the source and drain regions; and performing a second annealing of the device.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A method of forming metal-semiconductor compounds in a semiconductor device includes subsurface depositing of additional metal during the formation process. In particular, a first annealing may be used to form metal-semiconductor compound regions by chemically combining semiconductor material with material from an overlying metal layer. Then the additional metal may be deposited, such as be ion implantation. Following the depositing, a second annealing may be performed to recrystallize the metal-semiconductor compounds and/or to increase the size of the metal-semiconductor regions. The resulting metal-semiconductor compound regions may have improved properties, such as reduced barrier height, lower contact resistance, and/or more gradual concentration gradient between the metal-semiconductor compound regions and regions with only semiconductor material.

Figure 1:
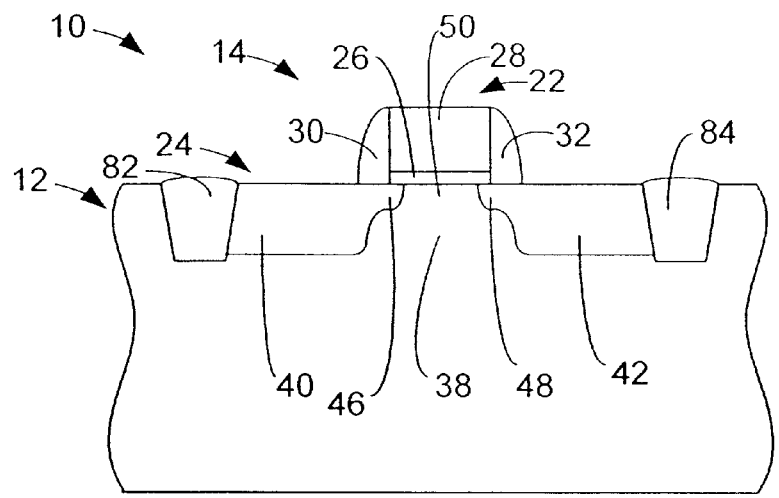
FIGS. 1–6 are schematic cross-sectional views of various steps in a method of fabricating the semiconductor device.

In a method in accordance with the present invention, first a semiconductor device 10 as illustrated in FIG. 1 is provided. The semiconductor device 10 includes a wafer 12 with a transistor 14, such as a field effect transistor (FET), formed thereupon. The wafer 12 may be a bulk semiconductor material wafer, or alternatively may another type of semiconductor wafer, such as a semiconductor-on-insulator (SOI) wafer. The wafer 12 may include silicon, although it will be appreciated that other suitable materials may be used instead or in addition.

The transistor 14 includes a gate 22 formed on an active surface semiconductor region 24 of the wafer 12. The gate 22 includes a gate dielectric 26 and a gate electrode 28. In addition, spacers 30 and 32 are on respective opposite sides of the gate 22. Exemplary materials for the gate dielectric 26 are $SiO_2$ and $Si_3N_4$. The gate electrode 28 may be made of polysilicon or another semiconductor. Alternatively, the gate electrode may be made in whole or in part of metal. An exemplary material for the spacers 30 and 32 is SiN.

The active region 24 includes a body 38, with a source 40 (also referred to as "source region") and a drain 42 (also referred to as "drain region") on respective opposite sides of the body. The source 40 and the drain 42 have respective source and drain extensions 46 and 48. As is conventional, the body 38 is primarily of different conductivity semiconductor material than the source 40 and the drain 42. For instance, the body 38 may be P-conductivity silicon while the source 40 and the drain 42 may be N-conductivity silicon. Alternatively, the body 38 may be N-conductivity silicon while the source 40 and the drain 42 may be P-conductivity silicon. The body 38, the source 40, and the drain 42, are operatively coupled with the gate 22 to function as a transistor.

The active region 24 is laterally isolated from other structures of the device 10 by insulator-filled trenches 82 and 84 on opposite sides of the active region.

The semiconductor device 10 shown in FIG. 1 may be produced by conventional methods. For example, the gate dielectric 26 and the gate electrode 28 may be formed by chemical vapor deposition of suitable materials, followed by selective removal, as in by etching. The insulator-filled trenches 82 and 84 may be trenches filled with silicon dioxide ($SiO_2$), formed using known shallow trench isolation (STI) techniques.

The source 40 and the drain 42 may be formed by a two-step doping process, with formation of the spacers 30 and 32 formed in between the two doping steps. The first doping may be a low-energy shallow doping primarily for formation of the extensions 46 and 48, using the gate 22 as a mask. Then the spacers may be formed, by conformal deposition of a suitable material, such as CVD of silicon dioxide, followed by anisotropic etching with well-known suitable etchants. Finally, a high-energy deep doping is performed to form the remainder of the source region 40 and the drain region 42.

It will be appreciated that suitable alternative techniques may be used in forming the semiconductor device illustrated in FIG. 1. For example, alternative isolation techniques such as LOCOS may be employed. As another example, suitable tilted implants may be used to form the source extension 46 and the drain extension 48, if desired.

Figure 2:
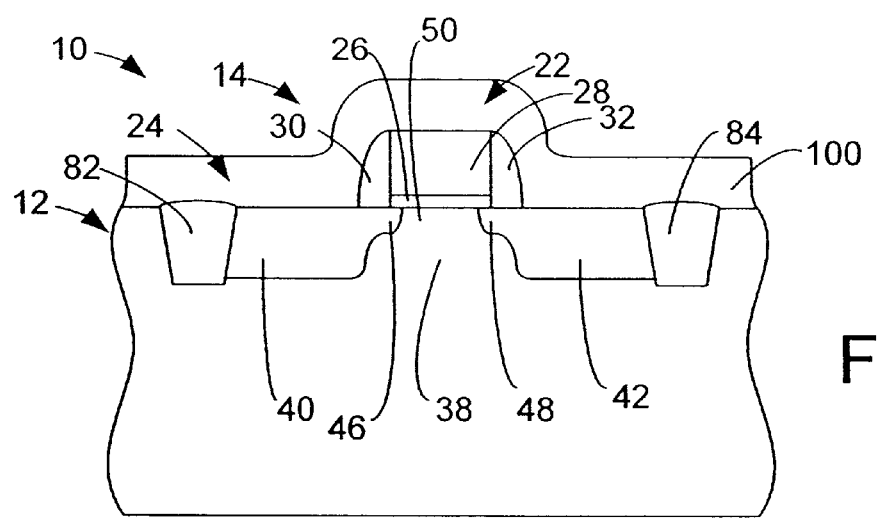

Turning now to FIG. 2, a metal layer 100 is deposited on the exposed surfaces of the device 10. The metal layer 100 may be of a metal such as titanium, cobalt, or nickel, which is suitable for forming a conducting compound, such as a silicide, with the semiconductor material. The metal layer 100 may be deposited, for example, by sputtering. An exemplary thickness of the metal layer is from 400 to 500 Å.

Figure 3:
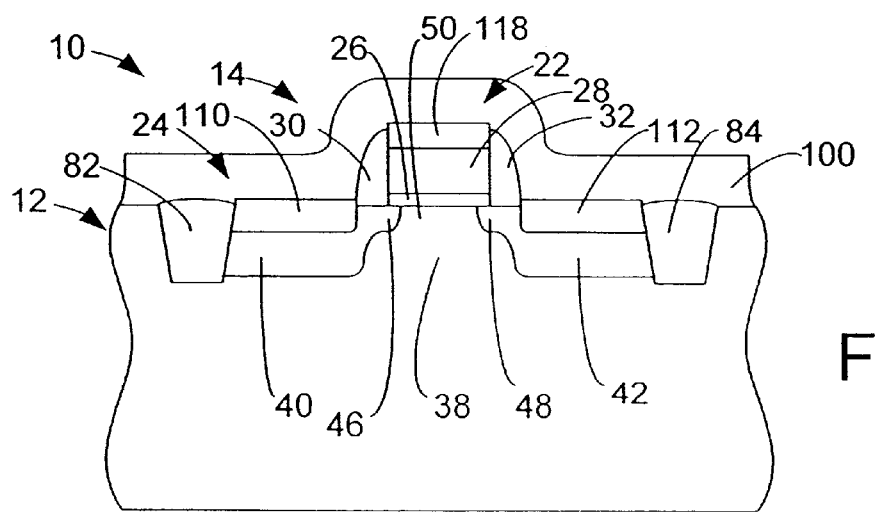

Then, as illustrated in FIG. 3, a first annealing is performed to produce a metal-semiconductor compound regions, such as silicide regions, in the source 40, the drain 42, and the gate electrode 28, thus producing respective metal-semiconductor compound regions 1 10, 1 12, and 1 18. The metal-semiconductor compounds may include compounds of titanium, cobalt, and/or tungsten. It will be appreciated that these are only examples, and that other suitable metal-semiconductor compounds may alternatively be used.

An exemplary range of temperatures for the annealing is between about 500 and 700° C., and an exemplary suitable length of time is between 10 seconds and 10 minutes. Rapid thermal annealing (RTA) may also be employed, for example subjecting the semiconductor device 10 to a temperature between 600 and 900° C. for about 5 to 120 seconds. It will be appreciated that other temperatures and times may be employed.

Figure 4:
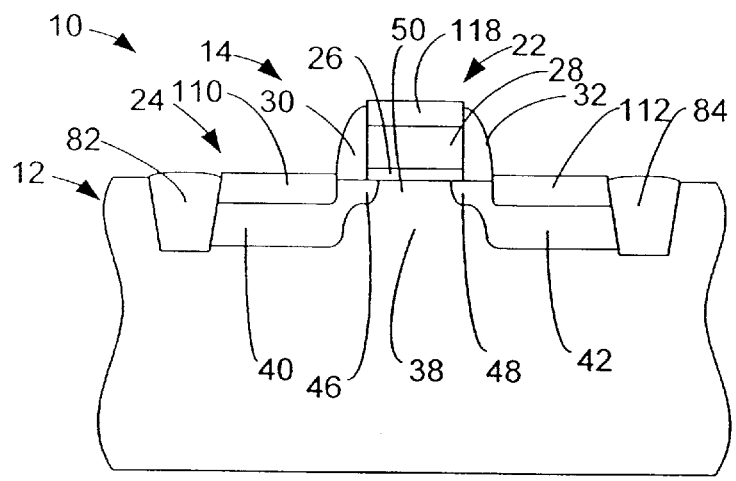

Referring to FIG. 4, excess metal of the metal layer 150 is removed by conventional, well-known means, such as by use of selective wet etching using one or more suitable etchants, for example using a mixture of sulfuric acid and water.

Figure 5:
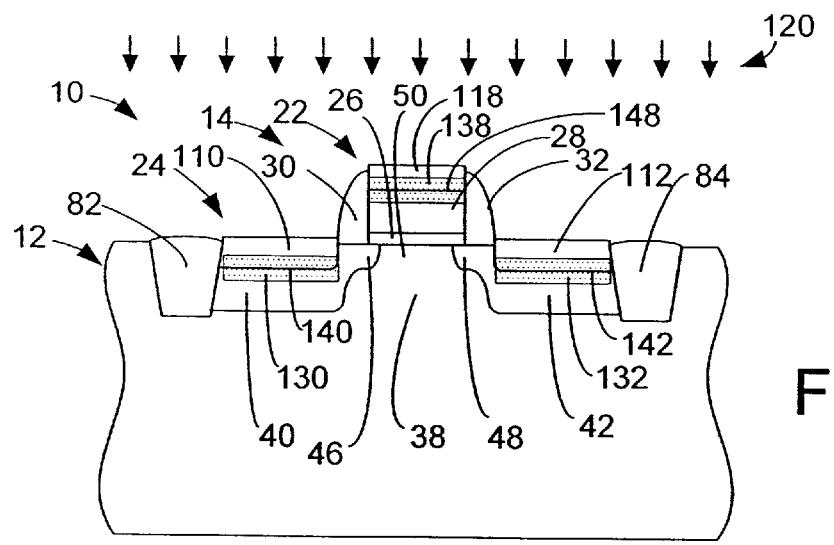
Figure 6:
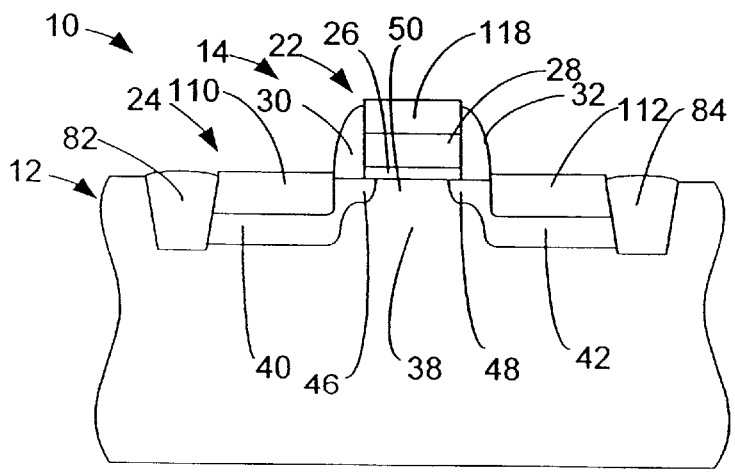

Then, as illustrated in FIG. 5, an ion implantation 120 is used to deposit metallic ions within the source 40, the drain 42, and the gate electrode 28. Respective implantation regions 130,132, and 138 are thereby created in the source 40, the drain 42, and the gate electrode 28.

The implantation 120 is used to provide additional metal within the device 10, for example providing additional metal along respective lower boundaries 140,142, and 148, between the metal-semiconductor compound regions 110, 112, and 118, and the source 40, the drain 42, and the gate electrode 28. For example, a peak concentration of metal ions from the ion implantation 120 may be substantially at one or more of the lower boundaries 140, 142, and 148. Alternatively or in addition, the peak concentration of metal ions from the ion implantation 120 may be above or below one or more of the lower boundaries 140,142, and 148. For example, having the peak below the lower boundary may help make more gradual the interface from metal-semiconductor compound to pure semiconductor material.

The material for the ion implantation 120 may be selected from the group of titanium, cobalt, and/or tungsten. The metallic ions for the ion implantation 120 may include ions of the same metal as that of the metal layer 100. Alternatively or in addition, the metallic ions for the ion implantation 120 may include ions of a different metal than that of the metal layer 100. The energy of the implanted ions may be from 10 to 1000 keV, and may be from 100 to 500 keV. It will be appreciated that the energy of the ion implantation 120 may be varied based on one or more of several factors, such of the type of ions to be implanted, the type of semiconductor material the ions are to be implanted into, and the size of the metal-semiconductor compound regions 110, 112, and 1 18. The concentration of the implanted ions may be from $5 \times 10^{20}$ to $5 \times 10^{22}$ ions/cm$^3$, and the peak concentration of the implanted ions may be between $1 \times 10^{22}$ to $5 \times 10^{22}$ ions/cm$^3$, although in both instances it will be appreciated that other suitable values are possible. The ions may be implanted to a depth of from 100 to 500 Å (angstroms). That is, the peak of the implant concentration may be at such a depth.

After the depositing of the additional metal, the device 10 is subjected to another annealing. The second annealing may serve to recrystallize the metal-semiconductor compounds, for example recrystallizing CoSi to $CoSi_2$. Also, the second annealing may cause some or substantially all of the additional metal deposited by the ion implantation 120 to combine with semiconductor material to form additional metal-semiconductor compound material. This formation of additional metal-semiconductor compound material may cause one or more of the metal-semiconductor compound regions 110, 112, and 118, to increase in size. For example, one or more of the metal-semiconductor compound regions 110, 112, and 118, may have an increased depth, with their lower boundaries moved downward.

The time and the temperature of the second annealing may be within the time and temperature ranges given above with regard to the first annealing.

The metal-semiconductor compound regions 110, 112, and 118, may have improved properties as a result of the deposition of the addition metal via the ion implantation 120. The implantation and the subsequent annealing may produce metal-semiconductor compound regions which are less abrupt, with a more gradual interface between metal-semiconductor compound and pure semiconductor material. This may advantageously result in reduced barrier height between metal-semiconductor compound regions and the corresponding regions of semiconductor material, and may result in reduced contact resistance between metal-semiconductor compound regions and the corresponding regions of semiconductor material.

It will be appreciated that the above-described structure and method are only exemplary, and that many suitable variations may be employed. For example, the semiconductor material may be silicon or another suitable semiconductor material, for example involving a material such as germanium. It may be possible to substitute oxides for nitrides, and/or vice versa, in the above structure and/or in the above fabrication method.

Some of the above-described method steps may be omitted or altered, if suitable. As another example, the shallow trench isolation step may be performed at a different stage during the manufacturing process. As a further example, the steps for forming the source and drain may be simplified, for example performed in a single implant. As a still further example, it will be appreciated that the ion implantation may be selective, with implantation into only selected surfaces and/or only or selected parts of surfaces. The selective implantation may be used to provide different metal-semiconductor compound region characteristics for different types of components of the device, and/or for different parts of components. It will be appreciated that other suitable modifications of the above-described method are possible.

The above-described method, then, is an improved method of forming metal-semiconductor regions in semiconductor devices. By depositing addition metal material during the process, formation of improved metal-semiconductor compounds and regions with such compounds may be facilitated.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making metal-semiconductor compound regions in a semiconductor device comprising:

depositing a metal layer on source and drain regions of a transistor;

annealing the device to form respective source and drain metal-semiconductor compound regions in the source region and the drain region;

removing unreacted metal of the metal layer; and implanting metal ions in the source region and the drain region.

2. The method of claim 1, further comprising, after the implanting, performing another anneal of the device.

3. The method of claim 1, wherein the implanting the metal ions includes implanting ions selected from the group of cobalt, nickel, and titanium.

4. The method of claim 1, wherein the metal layer includes a material selected from the group of cobalt, nickel, and titanium.

5. The method of claim 1, wherein the metal layer and the metal ions include the same metallic element.

6. The method of claim 5, wherein the metallic element is selected from the group of cobalt, nickel, and titanium.

7. The method of claim 1, wherein the implanting includes implanting at least some of the metal ions deeper than boundaries of the source and the drain metal-semiconductor compound regions.

8. The method of claim 7, wherein the implanting includes implanting a peak concentration of the metal ions is deeper than the boundaries of the source and the drain metal-semiconductor compound regions.

9. The method of claim 7, wherein the implanting includes implanting a peak concentration of the metal ions is at substantially a depth of the boundaries of the source and the drain metal-semiconductor compound regions.

10. The method of claim 1, wherein the implanting includes implanting the metal ions to a depth from 100 to 500 Å (angstroms).

11. The method of claim 1, wherein the implanting includes implanting the metal ions with an energy from 100 to 500 keV.

12. The method of claim 1, wherein the implanting includes implanting the metal ions at a concentration from $5 \times 10^{20}$ to $5 \times 10^{22}$ ions/cm$^3$.

13. A method of making silicide regions in a semiconductor device comprising:

depositing a metal layer on source and drain regions of a transistor;

performing a first annealing of the device to form respective source and drain metal-semiconductor compound regions in the source region and the drain region;

removing unreacted metal of the metal layer;

depositing additional metal in the source and drain regions; and performing a second annealing of the device.

14. The method of claim 13, wherein the depositing includes depositing at least some of the additional metal deeper than the metal-semiconductor compound regions.

15. The method of claim 14, wherein the depositing includes depositing a peak concentration of the additional metal deeper than the metal-semiconductor compound regions.

16. The method of claim 13, wherein the depositing the additional metal includes depositing a peak concentration of the additional metal approximately at lower boundaries of the metal semiconductor regions.

17. The method of claim 13, wherein the depositing includes implanting metal ions into the source region and the drain region.

18. The method of claim 13, wherein the metal layer and the additional metal include the same metallic element.

19. The method of claim 13, wherein the metal layer and the additional metal include different metallic elements.

20. The method of claim 13, further comprising, prior to the depositing the metal layer, forming the source and drain regions.

21. The method of claim 13, wherein the second annealing results in information of additional metal-semiconductor compound material from the additional metal, thereby increasing size of the source and drain metal-semiconductor compound regions.

22. The method of claim 21, wherein the second annealing increases depth of the source and drain metal-semiconductor compound regions.

23. The method of claim 1, further comprising, prior to the depositing the metal layer, forming the source and drain regions.

24. The method of claim 2, wherein the performing the another anneal results in formation of additional metal-semiconductor compound material from the metal ions, thereby increasing size of the source and drain metal-semiconductor compound regions.

25. The method of claim 24, wherein the performing the another anneal increases depth of the source and drain metal-semiconductor compound regions.

* * * * *

UNITED STATES PATENT AND TRADEMARK OFFICE
CERTIFICATE OF CORRECTION

PATENT NO. : 6,440,806 B1
DATED : August 27, 2002
INVENTOR(S) : Xiang

It is certified that error appears in the above-identified patent and that said Letters Patent is hereby corrected as shown below:

Column 1,
Line 53, replace "metalsemiconductor" with -- metal-semiconductor --

Column 7,
Line 7, replace "in information" with -- in formation --

Signed and Sealed this

Eleventh Day of February, 2003

JAMES E. ROGAN
*Director of the United States Patent and Trademark Office*